United States Patent [19]

Basilico et al.

[11] 4,337,534

[45] Jun. 29, 1982

[54] SOLID STATE ELECTRO-OPTICAL TRACK FOLLOWER ARRAY

[75] Inventors: Albert R. Basilico, Hyde Park; Raymond J. Wilfinger, LaGrangeville, both of N.Y.

[73] Assignee: Discovision Associates, Costa Mesa, Calif.

[21] Appl. No.: 239,953

[22] Filed: Mar. 3, 1981

Related U.S. Application Data

[63] Continuation of Ser. No. 31,252, Apr. 18, 1979, abandoned.

[51] Int. Cl.³ .......................... G11B 7/00; G11B 7/12
[52] U.S. Cl. .................................... 369/111; 369/46; 369/120; 369/124
[58] Field of Search ............................... 358/127–132; 365/127; 250/202, 209; 235/435; 360/63, 71, 77; 369/111, 120, 124, 44, 46

[56] References Cited

U.S. PATENT DOCUMENTS

| | | | |
|---|---|---|---|
| 3,158,848 | 11/1964 | Silverman | 360/71 |
| 3,252,143 | 5/1966 | Sundblad | 365/127 |
| 3,609,373 | 9/1971 | Desai | 250/202 |
| 3,780,266 | 12/1973 | Mudsam et al. | 360/77 |
| 4,003,089 | 1/1977 | Maurer | 360/33 |
| 4,051,528 | 9/1977 | Takeda et al. | 179/100.3 V |

Primary Examiner—Raymond F. Cardillo, Jr.
Attorney, Agent, or Firm—Ronald J. Clark

[57] ABSTRACT

Reflected light from the record in a optical disk player is directed at a string of photo sensitive diodes. Two adjacent diodes of this string of diodes receive light from a selected portion of the track on the disk. The outputs of these two adjacent diodes are summed together to generate the output signal for the optical disk player. The outputs of the two diodes are also subtracted from one another to generate a differential signal for tracking purposes. The magnitude of this differential signal is a measure of the relative magnitudes of the signals on the two adjacent diodes and therefore is one indication of how much of the light from the selected portion of the track reaches each of the diodes. When this differential output becomes larger than a preselected value, decode circuitry responds by changing the combination of adjacent diodes in the string to generate the video output signal and the difference signals.

5 Claims, 5 Drawing Figures

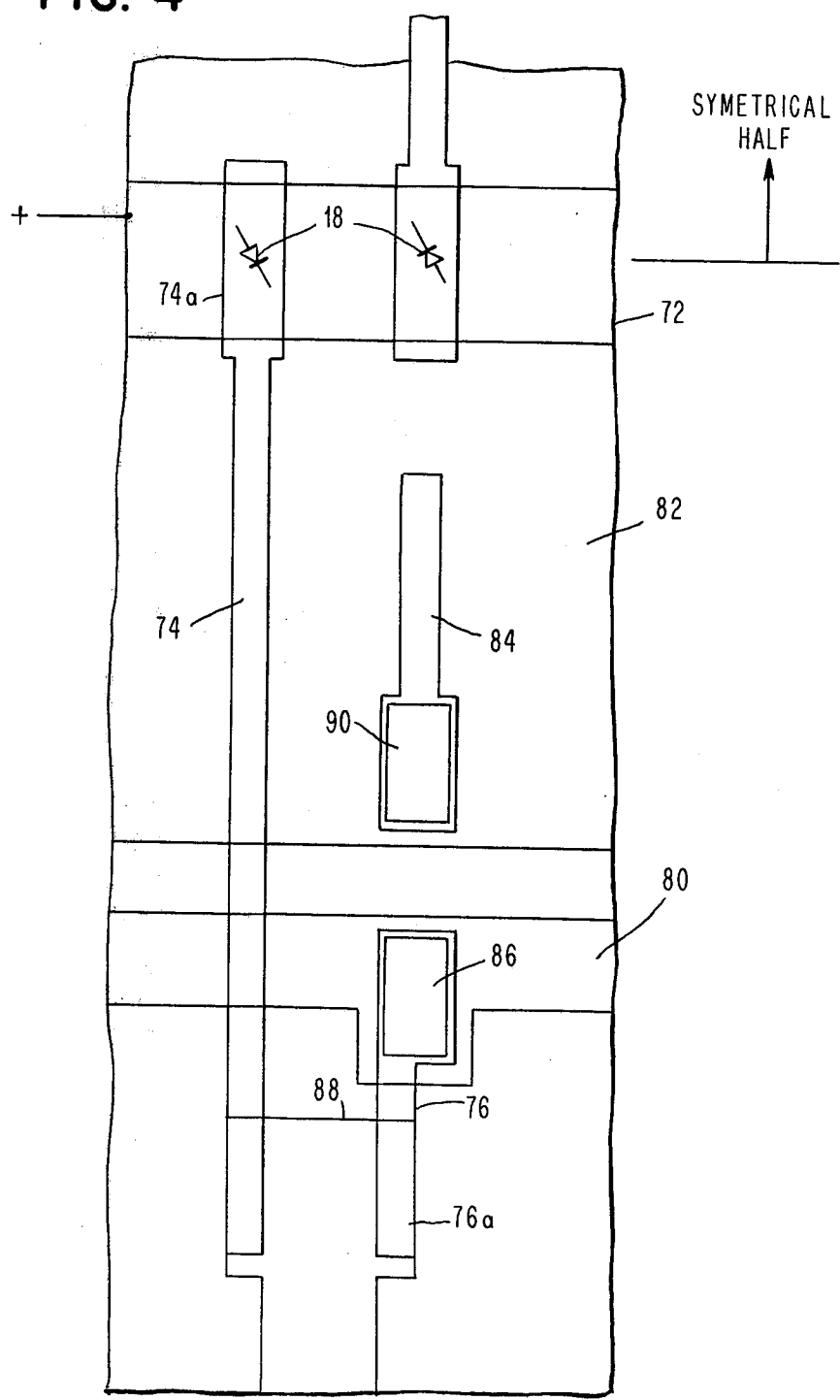

SOLID STATE ELECTRO-OPTICAL TRACK FOLLOWER ARRAY

This is a continuation of application Ser. No. 31,252, filed Apr. 18, 1979, now abandoned.

BACKGROUND OF THE INVENTION

The present invention relates to optical disk players and more particularly to the tracking mechanism for optical sensing devices.

In certain optical disk players optical sensing of a spiral track or alternatively circular tracks on the disk is accomplished by reflecting light off the surface of the disk and onto a photo-optic sensor. One way of tracking in such an optical recorder is to move the photo-optic sensor radially inward as the disk rotates so the photo-optic sensor scans the entire disc. One problem with such a tracking and sensing system is that because of manufacturing tolerances and other problems the spiraling of the track is not uniform but has eccentricities. These eccentricities cause cross talk in the optically sensed data and also cause the skipping of certain sections of the track while repeating other sections of the track.

In the past many systems have been proposed to permit the photo-optic sensor to track data recorded with the described eccentricities. One such tracking system involves the use of mirrors. As shown in U.S. Korpol Pat. No. 3,931,459 a mirror directs light through a disc into two photo sensitive devices to generate outputs which are summed to generate the output for the video disc player and which are subtracted to generate a tracking control signal for positioning the mirror. Another tracking system uses a string of photosensitive devices for tracking. U.S. Pat. Nos. 3,158,846 and 3,780,266 both describe an array of photo-optic devices with circuitry that is responsive to the diodes outputs to switch connections for tracking purposes.

THE INVENTION

In accordance with the present invention, a new combination electronic tracking means and photo-optic sensor is provided. The photo-optic sensor is a multiplicity of electronic sensing devices fabricated in a string on a monolithic chip. Light from the desired portion of the track is initially focused onto two of the sensing devices in the string. The outputs of those two devices are summed together to produce the video output signal for the optical disc player and are also subtracted from one another to generate a differential output for tracking purposes. This differential output is a comparison of the magnitudes of the electrical outputs of the two devices to each other and therefore is a measure of how much light is reaching each of the diodes. When the differential output becomes larger than a preselected magnitude the decode circuitry responds by changing the combination of adjacent devices used to generate the video output signal and the difference signals.

The devices are arranged so that the output terminals of each two adjacent devices are on opposite sides of the array. This makes it possible to increase the density of the diodes on the monolithic chip and thereby increase the resolution of photo-optic sensor. The decode circuitry includes a switching mechanism which reverses the photosensitive device connections to the decode circuitry as they switch during tracking.

Therefore, it is an object of the present invention to provide a new optical sensor for a video disk player.

Another object of the present invention is to provide an optical sensing mechanism for a video player which electronically tracks the selected track.

A further object of the present invention is to provide a sensor with high resolution for a video system.

THE DRAWINGS

Figure 2:
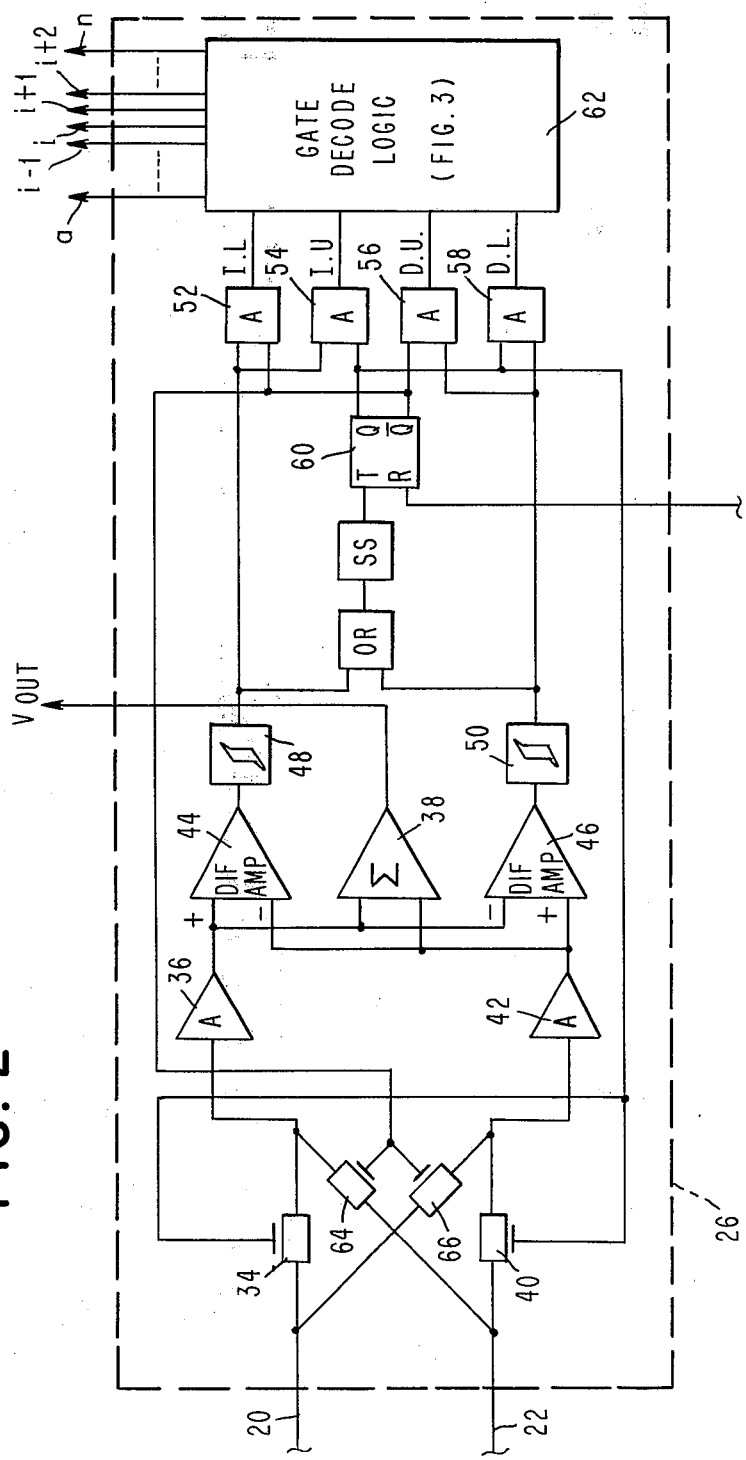
FIG. 2 is a circuit diagram of a control logic in block form in FIG. 1.
Figure 3A:
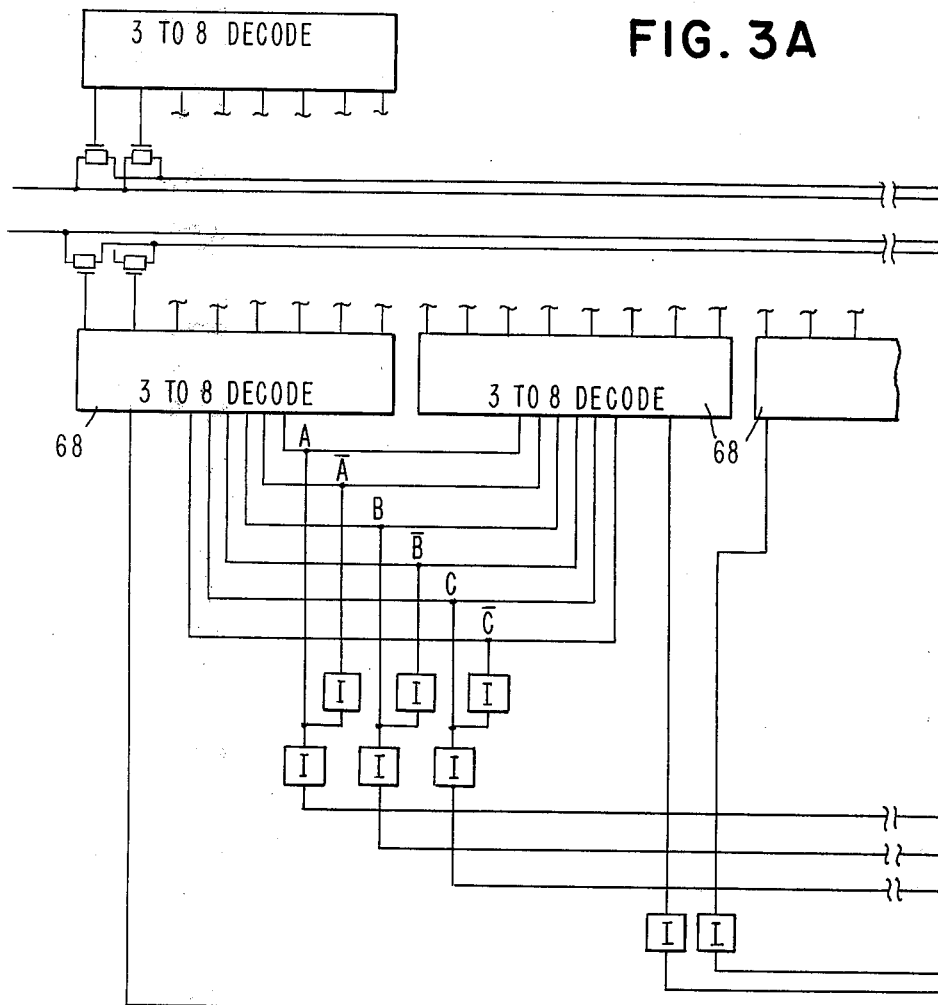

FIGS. 3A and B are circuit diagrams of the gate decoding circuit shown in block form in FIG. 2.

FIG. 4 is a plan view of the photo-optic sensor chip.

DETAILED EMBODIMENT OF THE INVENTION

Figure 1:
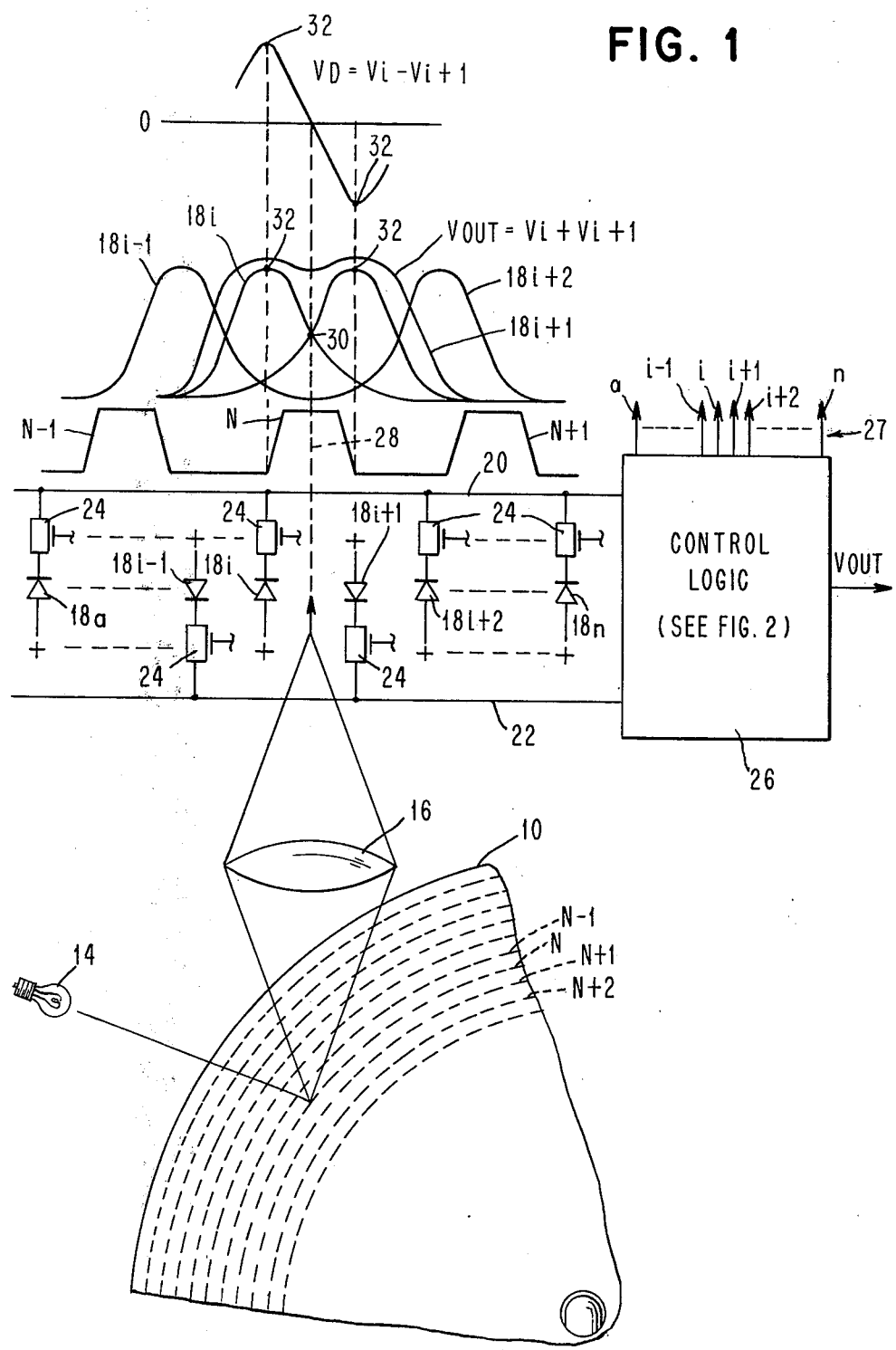
FIG. 1 is a schematic of the present invention.

Referring to FIG. 1, a disk 10 with a spiralling track 12 of digitally encoded information on it is illuminated by a light source 14. Light reflected off the encoded information in the track provided is more intense than that reflected off the guard bands between the turns of the track. This reflected light passes through a magnifying lens 16 and is focused on an array of diodes 18.

The diodes of the array are arranged in a string. Electrical connections to adjacent diodes in the string are made to two different output lines 20 and 22 on opposite sides of the string. The diodes 18 are each coupled to one of the lines 20 or 22 thru an enhancement mode field effect transistor (FET) 24. At any one time only two of the FET's are biased conductive to electrically connect one diode $18_i$ to line 20 and another diode $18_i+1$ to the line 22. These two diodes are adjacent to each other and have their outputs summed by the logic circuitry 26 to generate the video output signal V Out.

The logic circuitry 26 not only provides the output signal for the video player but it also generates selection signals on decode lines 27 for the gates of the devices 24 that connect the two diodes $18_i$ and $18_{i+1}$ to the lines 20 and 22. To this end the logic circuitry 26 generates an up or high level signal on two and only two decode lines 27 thereby biasing of two FET's 24 on and provides down voltages on all the other decode lines 27 to maintain all the other FET's 24 biased off.

The selection of the two diodes 18 is made on the basis of which two diodes in the array are in position to optically sense the desired portion of the spiralling track.

To understand this, let us assume that the two diodes $18_i$ and $18_{i+1}$ are optically centered over the Nth revolution of the track and electrically connected to the lines 20 and 22 respectively. The diodes $18_i$ and $18_{i+1}$ would then be operating at point 30 of their output curves. When operating at this point, neither diode $18_i$ or $18_{i+1}$ is sensitive to light from adjacent tracks $N-1$ or $N+1$. If the spiral of the track were true, movement of the sensor across the record by mechanical devices alone would be sufficient to maintain the diodes $18_i$ and $18_{i+1}$ in registration with the track as it spirals inwardly. However, since the position where the light from track N hits the diodes array 18 changes considerably due to record eccentricities, it is possible that either diode $18_i$ and $18_{i+1}$ will start reading adjacent tracks $N-1$ or $N+1$. For instance, if the light reflected from revolution N were to move to the other side of diode $18_i$ light reflected from revolution $N+1$ would fall within the operating spectrum of diode $18_{1+1}$. However, the position which reflected light from track N hits the sensor can be allowed to vary considerably without changing either of the diodes $18_i$ or $18_{i+1}$ which supply the two components of the output signal. In fact, the point at which light from the center track N hits the array of diodes can change from the center of diode $18_i$ to the center of diode $18_{i+1}$ without picking up light from adjacent tracks $N-1$ and $N+1$ with diode $18_i$ or $18_{i+1}$. Larger drifts than this can result in picking up data from adjacent tracks and for this reason the diodes producing the two components of the output signal are changed with such larger drifts.

The difference voltage VD, between the two output voltages $V_i$ and $V_{i+1}$ corresponding to the currents from the diodes $18_i$ and $18_{i+1}$ is used to determine when changes in diodes are to be made.

At point 30 on their operating curves the diodes $18_i$ and $18_{i+1}$ produce outputs which are identical so that the difference voltage VD is equal to zero. However, let us assume that the light from track N drifts because of some eccentricity of the disc. The one diode would produce a larger output signal than the other diode. The present invention makes use of this increase in the difference voltage to switch the exciting voltage on the gate of the devices 24 coupling the diodes 18 to the lines 20 and 22. The diodes 18 are spaced so that the operating spectrum of the diodes are each as wide as the track or the guard band between the track. Therefore, the voltage difference VD will increase until either diode $18_i$ or $18_{i+1}$ is optically centered over the track. VD max can then therefore be used to change the combination of diodes 18 used to produce the output signal. Referring to FIG. 2, we can see how this is done. For a moment let us again assume that the circuit is operating with diodes $18_i$ and $18_{i+1}$ supplying the signals generating the output signal V Out. The output of $18_i$ is produced on lines 20, fed through device 34, gain amplifier 36 and into the summing amplifier 38 while the output of device $18_{i+1}$ is put on line 22, passed through conductive devices 40, amplifier 42, and fed in the other output of the summing amplifier 38 to thereby produce the output signal V Out.

The output signals are also differentially summed in differential amplifiers 44 and 46. In differential amplifier 44 the signal coming through amplifier 36 is positive in the summation while in the differential amplifier 46 the signal coming through amplifier 42 is positive in the summation. The differential sum outputs are fed to trigger circuits 48 and 50. The threshold level for these trigger circuits is set at a point equal to or slightly less than the maximum output points 32 in the operating curves of the two diodes $18_i$ and $18_{i+1}$. Therefore, so long as the light is directed between the two diodes $18_i$ and $18_{i+1}$, there will be no pulse produced by the trigger circuits 48 or 50 and the outputs on lines 20 and 22 are the signals from diodes $18_i$ and $18_{i+1}$ respectively. However, now assume that light from the center of the track N drifts to the left so that it is directed at diode $18_i$ or beyond diode $18_i$. Then trigger circuit 48 will produce a pulse. Alternatively, if it is detected at diode $18_{i+1}$ or beyond diode $18_{i+1}$, trigger circuit 50 will produce a pulse. These pulses will be used to generate decode signals that will shift the two up voltages on gate lines i and i+1 one line in either direction.

The AND gates 52, 54, 56 and 58 and flip flop circuit 60 generate those decode signals. The output of both trigger circuits 48 and 50 are coupled to the trigger input of flip flop 60. The output of trigger circuit 48 is fed to one terminal of two input AND gates 52 and 54, and the output of trigger circuit 50 is fed to one terminal of AND gates 56 and 58. The other terminal of AND gates 54 and 58 is the Q output of the flip flop 60 and the other input to the AND gates 52 and 56 are the $\bar{Q}$ output of the flip flop 60. Each time one of the trigger circuits 48 and 50 produce a pulse one and only one of the AND gates 52 to 58 to produce a pulse. This pulse disconnects either diode $18_i$ from line 20 or diode $18_{i+1}$ from line 22 and connects either diode $18_{i+2}$ to line 20 or diode $18_{i-1}$ to line 22 resulting in the shift of the conducting diodes one diode position in either direction along the diode string. This will be discussed in more detail with references to FIG. 3.

The outputs Q and $\bar{Q}$ also control whether the signal on line 20 is fed to amplifier 36 or 42 and whether the signal on line 22 is fed to amplifier 36 or 42. For instance, let us assume that the flip flop 60 is in its Q state while diodes $18_i$ and $18_{i+1}$ are conducting and the track position shifts sufficiently to cause trigger circuit 48 to produce a pulse. This pulse will be fed to the trigger terminal of flip flop 60 switching the flip flop from its Q state to its $\bar{Q}$ state with the flip flop 60 in the $\bar{Q}$ state devices 64 and 66 will be rendered conductive and devices 34 and 40 will be rendered non-conductive. The effect of this is to couple diode $18_{i+1}$ to the amplifier 36 and diode $18_{i-1}$ to the amplifier 42.

Figure 3B:
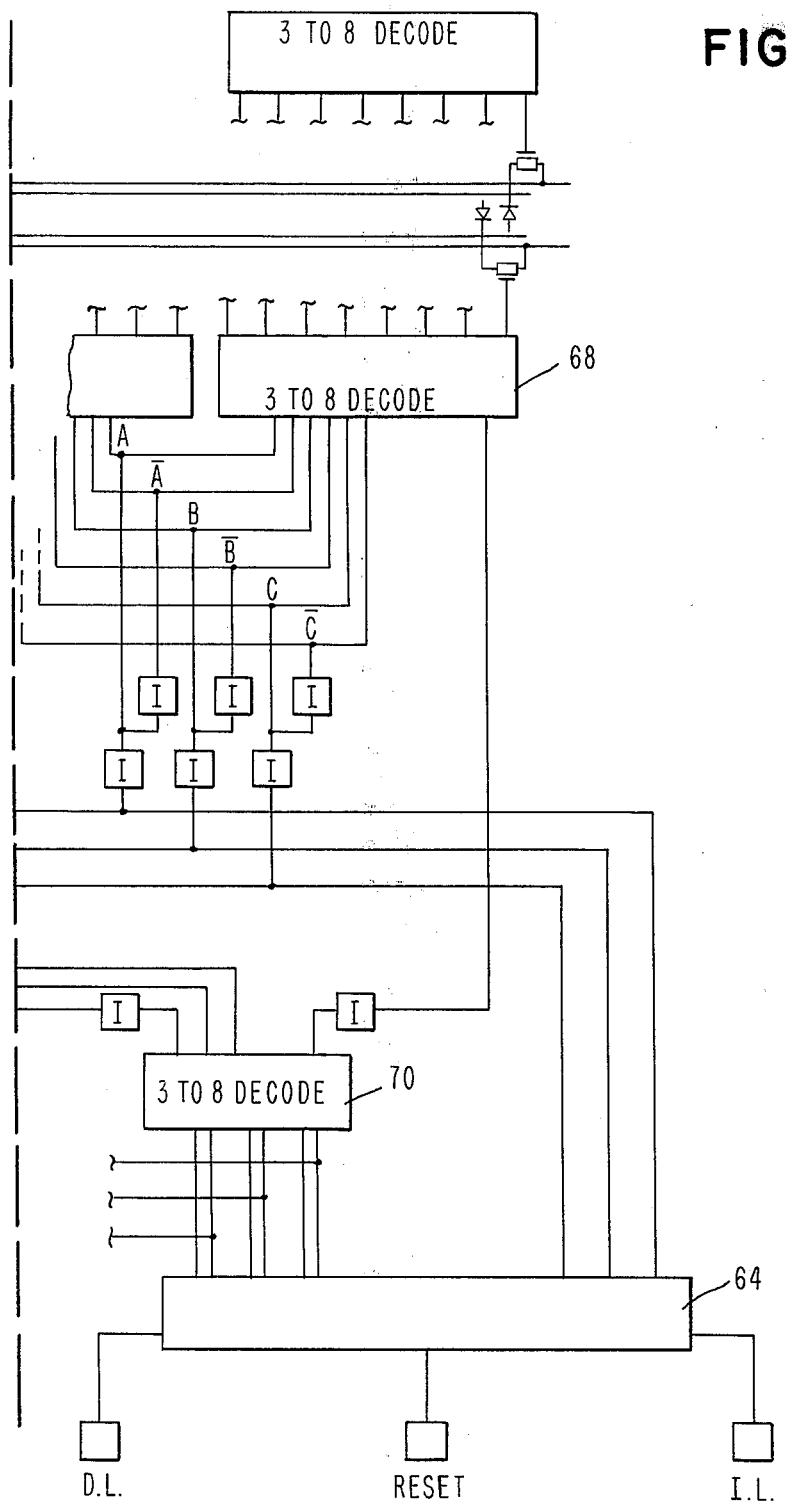

In the decoding circuitry 62, the signals generated by AND gates 52 through 58 control the count on two counters. As shown in FIG. 3, the output of AND gate 52 is coupled to the increment input to the counter 64 and the output of AND gate 58 is coupled to the decrement input to the counter 64 associated with the lower line 22. The counter 64 is a six bit up/down counter. The production of a pulse by AND gate 52 will increase the count in the counter by one and production of the pulse by AND gate 58 will decrease the count in the counter by one. The true and complements of the three low order bits of counter 64 are generated and fed to the inputs of eight separate 3 to 8 decoders 68. The true and complement of the three high order bits of the counter 64 are fed to the inputs of another 3 to 8 decoder 70. Each of the eight outputs of the decoder 70 is a gating signal for one of the decoders 68 so that with each count of the counter, the decoder 70 selects and activates one and only one of the decoders 68 using the high order digits of counter 64 and then the low order bits of the counter are used to place a positive voltage on one and only one output of the activated decoder 68 to render conductive 1 of the 64 devices 24 connected to the line 22. In this way, a different one of the 64 diodes is connected to the line 22 with each count. The decode circuitry associated with the upper line 20 is identical as those controlling the connections to the lower line, with the exception that the AND gate 54 drives the increment input and AND gate 56 drives the decrement input to the counter associated with the upper line 20.

FIG. 4 shows a layout of a diode 18 and its associated connections for the lower half of the sensor. The layout for a diode 18 in the upper half of the sensor is the mirror image of the layout shown here. A substrate of P type material contains a number of N type diffusions. The diffusion 74 contains an enlarged portion $74_a$ which functions as the cathode of the diode 18. The other end of the diffusion 74 is the source of the FET 24 coupling the diode to the line 22. The narrow end $76_a$ of a diffusion 76 forms the drain of the FET 24. A metalization pattern 88 overlying the diffusion 74 and 76 on an insulating layer forms the gate for the device and the coupling to the gate decode logic 68. A second metalization pattern 80 on the insulating layer forms the line 22. The line 22 is connected to the drain of the FET 24 by a metal connection through the insulating layer. A third metalization pattern 82 forms a line which overlies and is connected to a diffusion 84 by a metal connection 90 through the insulating layer to form a FET for voltage clamping purposes. A second insulating layer covers all of the chip and it is covered by a second metalization layer which covers the whole chip except the diodes 18 to shield the circuitry from light.

Above I have described one of the embodiments of the invention. A number of changes can be made in this embodiment. For instance, in the described embodiment the 128 diodes 18 of the sensor are driven by mechanical means to move radially across the face of the disc. A longer stationary string of diodes 18 could be used to read the whole disc without movement and avoid the use of a drive mechanism. Also in the discussion it was assumed that the track provided a more intense reflection than the surrounding guide bands. The present invention would work equally as well if the opposite were true. Therefore, it should be understood that these and other changes can be made in the described embodiment without departing from the spirit and scope of the invention.

Having thus described our invention, what we claim as new, and desire to secure by Letters Patent is:

1. A tracking circuit for use in a playback system for an optical information storage device which optically reads information from a spiral shaped track carried by a rotating data disc, comprising:

a multiplicity of adjacently positioned photo-optic sensors, and each of said sensors having an output terminal;

means for illuminating said spiral shaped track;

means for imaging light reflected from the spiral shaped track upon at least two of said light sensitive devices;

each of said multiplicity of photo-optic sensors being employed for generating an output voltage representative of the intensity of the light impinging upon said sensor at its respective output terminal;

a lower signal line;

an upper signal line;

a plurality of photo-optic sensor switching means, and each of said photo-optic sensor switching means having at least first, second and third terminals;

alternate ones of said sensors being selectively connected to said lower signal line by respective photo-optic sensor switching means;

remaining ones of said sensors being selectively connected to said upper signal line by respective photo-optic sensor switching means;

said first terminal of each of said photo-optic sensor switching means being connected to one of said lower signal line and said upper signal line;

said second terminal of each of said photo-optic sensor switching means being connected to said output terminal of respective ones of said photo-optic sensors;

a decode circuit means for generating first level and second level control signals for application to said third terminal of each of said photo-optic sensor switching means;

each of said photo-optic sensor switching means operating to connect said voltage generated by its respective photo-optic sensor to its respective upper and lower signal line when said control signal of said first level is present at said third terminal and operating to disconnect said voltage generated by its respective photo-optic sensor from its respective upper and lower signal line when said control signal of said second level is present at said third terminal;

said decode circuit means generating at least one first level control signal for application to one of said photo-optic switching means connecting said sensors to said lower signal line and at least one additional first level control signal for application to an adjacent one of said photo-optic switching means connecting said sensors to said upper signal line;

differential signal combining means responsive to said output voltage signal on said lower signal line and said output voltage signal on said upper signal line as gated by said first level control signals from said decode circuit means for generating at least a first difference output signal and a second difference output signal, said first difference output signal being the difference between a first voltage signal on said upper signal line and a second voltage signal on said lower signal line, and said second difference output signal being the difference between said second voltage signal and said first voltage signal;

said differential signal combining means includes a first differential amplifier for generating said first difference output signal and a second differential amplifier for generating said second difference output signal and each of said first and said second differential amplifiers having a positive input terminal and a negative input terminal;

said differential signal combining means further including a first input amplifier and a second input amplifier;

said first input amplifier being connected to said positive input terminal of said first differential amplifier and to said negative terminal of said second differential amplifier;

said second input amplifier being connected to said positive input terminal of said second differential amplifier and to said negative terminal of said first differential amplifier;

input switching means positioned intermediate said upper and lower signal lines and said first and second input amplifier for selectively connecting said upper signal line with one of said first and second amplifiers and for selectively connecting said lower signal line with the other one of said first and second amplifiers;

said input switching means including at least first and second direct switching means and further including at least first and second cross switching means, and each of said direct and cross switching means having at least first, second and third terminals;

said first terminal of said first direct switching means and said first terminal of said first cross switching means being responsive to said signal on said upper signal line, said first terminal of said second direct switching means and said first terminal of said second cross switching means being responsive to said signal on said lower signal line;

said second terminal of said first direct switching means and said second terminal of said second cross switching means being employed for selectively furnishing an input to said first input amplifier, said second terminal of said second direct switching means and said second terminal of said first cross switching means being employed for selectively furnishing an input to said second input amplifier;

signal generating means responsive to said output signals from said differential signal combining means for providing at least both a first signal indicating said first difference output signal exceeds a first preselected value and second signal indicating said second difference output signal exceeds a second preselected value;

a bistable device of the type having two stable states and at least an input terminal and first and second output terminals;

said bistable device changing between its two stable states upon each application of an input signal to said input terminal and generating an output signal at each of said first and second output terminals, and each of said output signals at said first and second output terminals being at one of a first signal level and a second signal level, and said output signal at said first output terminal being at said first level when said bistable device in its first stable state and said output signal at said first output terminal being at said second level when said bistable device is in its second stable state, and said output signal level at said second output terminal of said bistable device being at the other level from the level of said output signal at said first output terminal;

said bistable device being responsive to said first signal and said second signal generated by said signal generating means for changing stable states upon the application of said last mentioned signals to said input terminal of said bistable device and for generating said first output signal and said second output signal from said first output terminal and second output terminal respectively;

said first output signal from said bistable device is applied as an input signal to said decode circuit means and as a control signal to said third terminal of said first and second cross switching means;

said second output signal from said bistable device is applied as a second input signal to said decode circuit means and as a control signal to said third terminal of said first and second direct switching means;

said output signals from said bistable device and said output signals from said signal generating means being applied to said decode means for generating said first level signals and said second level signals for application to said photo-optic switching means for changing the combination of adjacent photo-optic sensors used to generate said first difference signal and said second difference signal; and said output signals from said bistable device applied to said control terminals of said direct and cross input switching means being employed for changing the photo-optic sensor connections over said upper and lower signal lines to said first and second amplifiers as said decode means switches the connections of said photo-optic sensors to said upper and lower signal lines during tracking.

2. A tracking circuit as recited in claim 1, and further including:
summing means responsive to said output of said first amplifier and said second amplifier for summing the output of two adjacent ones of said light sensitive devices to provide an output signal for the optical data storage device.

3. A tracking circuit as recited in claim 1, wherein each of said photo-optic sensors has an operating spectrum as wide as the spiral shaped track.

4. A tracking circuit as recited in claim 1, wherein one of said first difference output signal and said second difference output signal increases until its respective photo-optic sensor is centered over the spiral shaped track.

5. A tracking circuit as recited in claim 1, wherein each of said photo-optic sensors generates an output voltage lying between a lower voltage level and an upper voltage level, and said first and said second preselected values are closer to said upper voltage level.

* * * * *